United States Patent
Witvrouw et al.

(10) Patent No.: US 8,062,497 B2
(45) Date of Patent: Nov. 22, 2011

(54) METHOD FOR FORMING A HERMETICALLY SEALED CAVITY

(75) Inventors: Ann Witvrouw, Herent (BE); Raquel Hellin Rico, Elda (ES); Jean-Pierre Celis, Korbeek-Lo (BE)

(73) Assignee: IMEC, Leuven (BE)

( * ) Notice: Subject to any disclaimer, the term of this patent is extended or adjusted under 35 U.S.C. 154(b) by 864 days.

(21) Appl. No.: 11/729,305

(22) Filed: Mar. 28, 2007

(65) Prior Publication Data
US 2007/0298238 A1      Dec. 27, 2007

Related U.S. Application Data

(60) Provisional application No. 60/786,466, filed on Mar. 28, 2006.

(51) Int. Cl.
*C25D 5/02*     (2006.01)
(52) U.S. Cl. ............................................. 205/118
(58) Field of Classification Search ............. 205/118, 205/122, 170
See application file for complete search history.

(56) References Cited

U.S. PATENT DOCUMENTS

| 6,184,582 B1 * | 2/2001 | Coult et al. ............ 257/737 |
| 7,029,829 B2 | 4/2006 | Stark et al. |
| 7,160,429 B2 * | 1/2007 | Cohen et al. ............ 205/220 |
| 2002/0086520 A1 * | 7/2002 | Chiang ............ 438/630 |

FOREIGN PATENT DOCUMENTS

| EP | 1433741 | 6/2004 |
| WO | WO 2005-089348 A2 | 9/2005 |

* cited by examiner

*Primary Examiner* — Luan Van
(74) *Attorney, Agent, or Firm* — Knobbe Martens Olson & Bear LLP (57) ABSTRACT

One inventive aspect relates to a method for forming hermetically sealed cavities, e.g. semiconductor cavities comprising fragile devices, MEMS or NEMS devices. The method allows forming hermetically sealed cavities at a controlled atmosphere and pressure and at low temperatures, for example, at temperatures not exceeding about 200° C. The method further allows forming sealed cavities with short release times, for example, release times of about a few minutes to 30 minutes. The method may, for example, be used for zero level packaging of MEMS or NEMS devices.

20 Claims, 5 Drawing Sheets

METHOD FOR FORMING A HERMETICALLY SEALED CAVITY

CROSS-REFERENCE TO RELATED APPLICATIONS

This application claims priority under 35 U.S.C. § 119(e) to U.S. Provisional Patent Application No. 60/786,466 entitled "Method for the closure of openings in a film" filed on Mar. 28, 2006, which is incorporated by reference in its entirety.

BACKGROUND OF THE INVENTION

1. Field of the Invention

The present invention is related to microelectronic process technology, and more particularly to Micro- and Nano-Electro Mechanical Systems (MEMS and NEMS) process technology. The present invention relates to a method for forming a hermetically sealed cavity, for example a cavity comprising a MEMS or a NEMS device. Embodiments also relate to a wafer level encapsulation method for MEMS and/or NEMS devices.

2. Description of the Related Technology

Many micro-electromechanical systems (MEMS) require a hermetic encapsulation under vacuum or under a controlled atmosphere and pressure in order to ensure a good performance and/or an acceptable lifetime of operation. The encapsulation has to be performed without influencing the device performance. This often requires low-temperature processing, the absence of any aggressive or corrosive agents during encapsulation and sealing, and avoidance of deposition of sealing material onto the MEMS device, as all these can cause damage to the device.

Two approaches for device encapsulation can be defined. A first approach is encapsulation during first level packaging. However, when following this approach the fragile, often freely movable, MEMS device is exposed to contamination during wafer dicing and subsequent cleaning. A second approach is zero level packaging or wafer level packaging, whereby the package is designed and fabricated at the same time as the MEMS device. Zero level packaging may be obtained by means of wafer bonding (e.g. wafer-to-wafer or die-to-wafer bonding) or may be based on surface micromachining techniques.

The most popular approach is based on wafer bonding. In this case, sealing is performed by connecting a device wafer and a capping wafer (or a capping die) in which a cavity is made or a stand-off ring is implemented, by use of a reflowable material. In the wafer bonding approach a substrate such as a Si wafer or a MEMS substrate, is used as a cap to close the cavity comprising the MEMS device. These wafers are thick and the sealing ring is large. Therefore, this packaging approach is space consuming. Moreover, batch processing is not possible.

A more compact way of hermetic sealing of a MEMS device is to make use of thin-film caps realized by surface micromachining. In this approach, access holes or channels may be formed in the thin-film caps which allow passing through of e.g. a MEMS sacrificial layer etchant for etching away a sacrificial layer for forming a cavity. After forming a cavity and, optionally release of a MEMS device present in the cavity, the channel may be closed, thereby sealing the cavity.

In EP 1 433 741 a zero-level packaging method is described based on closing an opening or openings in a membrane using a reflow material, the openings being located above an underlying cavity in a substrate. The method comprises depositing an intermediate layer onto the membrane layer whereby this intermediate layer narrows down the openings to be sealed. Next, a reflow layer is deposited on the intermediate layer under a first set of pressure and atmosphere conditions to further partially close the openings. Then, the reflow layer is reflowed under a second set of pressure and atmosphere conditions to close the openings by the reflow layer. The intermediate layer prevents reaction between the sealing layer and the membrane layer, is stable during reflow and narrows down the openings to be sealed due to the formation of a collar or shoulder. This method allows hermetic sealing of openings in a film at controllable atmosphere and pressure. When using this method, there is, however, a risk that material of the different deposited layers passes through the openings and that this material is deposited on fragile micro-devices, such as MEMS devices, that may be located in the cavity under the openings, thereby affecting proper working of such micro-devices.

In the above-described method process temperatures are typically higher than 600° C. A method for hermetically sealing cavities at a lower temperature is disclosed in U.S. Pat. No. 7,029,829. This document describes a low-temperature method for forming a micro-cavity on a substrate and is particularly useful to package MEMS devices in vacuum on the wafer level and to provide sealed feed-throughs to the outside world. According to this method, the temperature may not exceed 250° C. during the entire method. In this method, the opening or openings to be sealed are not located above the underlying cavity, but large side ports, also called "horizontal" access holes, are used. Because the opening or openings which are used for releasing sacrificial material to form the cavity are not located above the cavity, there is never a risk that the MEMS device in the cavity would be harmed by the materials used passing through the holes and being deposited onto the MEMS device in the cavity. However, a disadvantage of these side ports or horizontal access holes is that release times of several hours are required for forming the cavity.

In WO 2005/089348 a method is described for packaging MEMS devices at low temperatures (200° C. to 300° C.), wherein no access holes are used. In this process an overcoat layer is deposited on a sacrificial polymer layer that is removed prior to package sealing. Removing the sacrificial polymer layer is based on thermal decomposition, whereby the decomposition products of the sacrificial layer diffuse through the overcoat layer. This results in release times of several hours.

SUMMARY OF CERTAIN INVENTIVE ASPECTS

Certain inventive aspects provide a good method for forming hermetically sealed cavities, e.g. semiconductor cavities.

The method allows hermetically sealing cavities at a controlled atmosphere and pressure and at low temperatures, for example at temperatures not exceeding about 200° C. The method allows forming sealed cavities with short release times, for example release times of about a few minutes to 30 minutes.

One inventive aspect relates to a method for forming a hermetically sealed cavity. The method comprises:
  providing a sacrificial layer onto a substrate lying in a plane,
  providing on the sacrificial layer at least one structure, preferably an elongated structure, e.g. a pillar, extending in a direction substantially perpendicular to the plane of the substrate, providing a membrane layer such that the at least one structure, for example elongated structure, e.g. pillar, is at least partially encompassed by the membrane layer along its height, providing a sealing layer on the membrane layer, the sealing layer covering the membrane layer and having openings at the location of the at least one structure, for example elongated structure, e.g. pillar, after providing the membrane layer and the sealing layer, removing the at least one structure, for example elongated structure, e.g. pillar, hereby forming at least one opening through the membrane layer in a direction substantially perpendicular to the plane of the substrate, removing at least part of the sacrificial layer through the at least one opening, hereby forming a cavity, and sealing the at least one opening in the membrane layer.

The method according to one inventive aspect uses a sacrificial layer forming a sacrificial spacer that is removed prior to sealing, with short release times, as compared to similar prior art methods, of approximately between a few minutes and 30 minutes. The release time may be less than about 30 minutes, preferably less than about 20 minutes, more preferably less than about 10 minutes and most preferably less than about 5 minutes. Furthermore the method according to one inventive aspect may comprise closing openings in the membrane layer with a reflow material without the need for an intermediate layer and without a risk of material deposition on fragile micro-devices that may be positioned in the cavity under the membrane layer.

The method according to one inventive aspect may for example be used for zero level packaging of MEMS or NEMS devices.

The method for forming a hermetically sealed cavity according to one inventive aspect comprises forming on a substrate a sacrificial spacer where the cavity is to be located, forming a membrane layer over the sacrificial spacer, the membrane layer comprising at least one opening, preferably a plurality of openings, forming a sealing layer on the membrane layer, removing at least part of the sacrificial spacer through the at least one opening or the plurality of openings to form the cavity, and sealing the at least one opening or the plurality of openings in the membrane layer.

According to one inventive aspect, the contour of the at least one opening or the plurality of openings in the membrane may be in a plane substantially parallel to the substrate. In one embodiment, forming a membrane layer comprising at least one opening or a plurality of openings may comprise forming an electrically conductive layer on the sacrificial spacer, the electrically conductive layer being a seed layer for electroplating, forming a patterned non-conductive layer on the seed layer, the pattern of the non-conductive layer comprising at least one structure, preferably an elongated structure, e.g. a pillar, and forming a membrane layer by electroplating a conductive material. The thickness of the membrane layer may be larger than the thickness of the patterned non-conductive layer, thereby partially overgrowing the patterned non-conductive layer, for example by an over-plating technique. Other suitable techniques known by a person skilled in the art may be used for forming the membrane layer and for forming the at least one opening or the plurality of openings.

According to one inventive aspect, providing at least one structure, for example an elongated structure, e.g. at least one pillar, may comprise providing a layer on the sacrificial layer and patterning the layer so as to form at least one pillar. In one embodiment, this layer may be an electrically non-conductive layer, for example having the function of a plating mould when in a next step a membrane layer is formed by means of electroplating. Patterning the non-conductive layer may be done by any suitable technique known by a person skilled in the art, such as e.g. lithography.

According to one inventive aspect, the method may furthermore comprise providing a seed layer before providing the membrane layer. The seed layer may comprise an electrically conductive material, such as for example a metal (e.g. Cu, Au, Ni, Cr, Pb, Sn or Ag).

In one inventive aspect, a nickel electroplated membrane may be formed, whereby additives such as for example Co, P, saccharin may be added to the Ni bath in order to obtain a stronger membrane. The stress in the membrane layer at the end of the process may preferably be a low tensile stress, preferably lower than about 100 MPa. According to one inventive aspect, the membrane layer may be rigid, for example with a Young's modulus exceeding about 100 GPa, and strong, with a large yield strength, preferably between about 60 MPa and 80 MPa and with a large tensile strength, preferably between about 90 MPa and 120 MPa.

The method according to one inventive aspect may be performed at a temperature below the critical temperature of the structure, preferably not exceeding about 200° C., i.e. each of the steps of the method may be performed at a temperature not exceeding about 200° C.

The sacrificial layer may be for example a layer of photoresist, a polymer, germanium, aluminum, silicon oxide, silicon or silicon germanium. The time needed for removing at least part of the sacrificial layer may be less than about 30 minutes, more preferred less than about 20 minutes, more preferred less than about 10 minutes, still more preferred less than about 5 minutes.

The sealing layer may be any material that can be deposited and that can be reflowed at a temperature below the critical temperature of the whole structure or device. Examples are metals, such as In, Ti, Ta, W, Al, Cu, Cr, etc., alloys, eutectic alloys, semiconductor materials such as Ge, etc., solder materials such as SnPb, Bi, etc. According to one inventive aspect, the sealing layer may be indium, which has a low melting temperature (about 156.61° C.). Preferably, the sealing layer may comprise a material with a low melting temperature, preferably below about 200° C., more preferred below about 180° C., still more preferred below about 160° C. The sealing layer may preferably be formed by means of a selective deposition technique such as for example electrodeposition or sputtering under an angle.

The method according to one inventive aspect may further comprise forming a wetting layer after providing, e.g. electrodepositing, the membrane layer and before forming the sealing layer. This wetting layer may reduce the surface tension of the sealing layer when reflowing it.

Sealing the at least one opening in the membrane layer may comprise reflowing the sealing layer such that the at least one opening is closed. In one embodiment no material passes through the at least one opening during sealing. Sealing the at least one opening may be performed at a predetermined atmosphere and at a predetermined pressure. The pressure may be essentially atmospheric pressure or may be lower than atmospheric pressure, for example vacuum.

In one inventive aspect the at least one opening or the plurality of openings may have a span approximately between 0.10 μm and 50 μm, between 0.25 μm and 40 μm, between 0.10 μm and 30 μm, between 0.10 μm and 20 μm or between 0.20 μm and 10 μm, the span being defined as the minimum value of the distance, measured orthogonally to the contour of the opening, for which shrinking the opening by moving the contour of the opening (orthogonally to the contour of the opening) with a same distance along the whole contour of the opening would cause the complete opening to be closed.

The hermetically sealed cavity formed by the method according to one inventive aspect may comprise fragile devices, MEMS devices or NEMS devices. The method may further comprise releasing such MEMS or NEMS devices after removing at least part of the sacrificial layer.

Particular aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 2 illustrates the span of an opening in case of a circular opening (FIG. 2a) and in case of a rectangular opening (FIG. 2b).

FIG. 3a-h schematically illustrate a process flow for hermetically sealing openings in a membrane according to embodiments of the present invention.

FIG. 4 shows a scheme of a sealing material plated above a membrane structures before reflow (FIG. 4a) and after reflow (FIG. 4b).

In the different figures, the same reference signs refer to the same or analogous elements.

DESCRIPTION OF VARIOUS ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

It is to be noticed that the term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present description, the most relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

When in the description or in the claims the term "a controlled atmosphere" is used, a controlled constitution of ambient gas is meant.

The terms "film" and "membrane" refer to the same technical feature and are interchangeable.

Furthermore, the terms "opening", "trench", "hole" and "access hole" refer to the same technical feature and are interchangeable.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

Certain embodiments provide a method for forming hermetically sealed cavities. The method comprises:
- providing a sacrificial layer onto a substrate lying in a plane,
- providing on the sacrificial layer at least one pillar extending in a direction substantially perpendicular to the plane of the substrate,
- providing a membrane layer such that the at least one pillar is at least partially encompassed by the membrane layer along its height,
- providing a sealing layer on the membrane layer, the sealing layer covering the membrane layer and having openings at the location of the at least one pillar,
- after provision of the membrane layer and the sealing layer, removing the at least one pillar, hereby forming at least one opening through the membrane layer in a direction substantially perpendicular to the plane of the substrate,
- removing at least part of the sacrificial layer through the at least one opening, hereby forming a cavity, and
- sealing the at least one opening in the membrane layer.

An advantage of the method according to embodiments of the invention is that removing at least part of the sacrificial layer may be done within less than about 30 minutes, preferably less than about 20 minutes, more preferably within less than about 10 minutes and most preferably within less than about 5 minutes. Hence, the method according to one embodiment comprises using a sacrificial layer that is removed prior to sealing, with, contrary to prior art methods, short release times, preferably in the order of between about a few minutes and 30 minutes. This is obtained by using a membrane with at least one and preferably a plurality of vertical openings. With vertical openings is meant that, when the substrate is lying in a plane, the holes are extending through the membrane in a direction substantially perpendicular to the plane of the substrate. This results in shorter release times compared to cases where one or a few horizontal openings are used (see U.S. Pat. No. 7,029,829). The openings have the function of access holes, giving access to, for example, an underlying structure or an underlying cavity, for example for a sacrificial layer etchant which may be used for removing at least part of the sacrificial layer. In this context, vertical access holes are holes extending through the membrane layer in a direction substantially perpendicular to the plane of the underlying substrate. Preferably, vertical access holes have their contour in a plane substantially parallel to the plane of the underlying substrate. In case of vertical openings through the membrane layer, the rate of sacrificial layer removal by etching may be determined by the distance between the access holes, while in the case of a horizontal opening the rate of the sacrificial layer removal by etching is determined by the amount of sacrificial material to be removed. Hence, according to one embodiment, the rate of removal of the sacrificial layer may be controlled by adjusting the distance between the access holes in the membrane layer. Removal of the sacrificial layer requires under-etching of the membrane layer between the access holes. From the etch-rate of the sacrificial layer and the under-etching distance (being the minimum distance between the contours of neighboring access holes), the release time can be estimated. For example, when a large cavity has to be formed and thus a lot of sacrificial material has to be removed, more access holes can be provided in the membrane layer at a shorter distance in order to increase the rate of removal of the sacrificial layer.

The method according to one embodiment may, for example, be used in the field of sealing techniques for wafer scale zero level packaging by thin film caps, for which it brings the advantages of hermetically sealing a cavity at a controlled atmosphere and pressure, and processing at low temperatures, e.g. lower than about 200° C.

The method according to embodiments of the present invention comprises closing at least one opening in a membrane layer, e.g. with a reflow material, without the requirement for an intermediate layer and without a risk for deposition onto fragile micro-devices, e.g. MEMS or NEMS devices, of materials used for providing the different layers, which micro-devices may be positioned in the cavity under the membrane layer.

Figure 1:
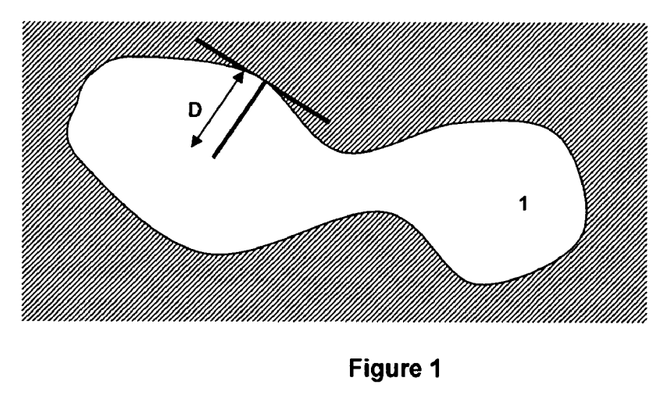
FIG. 1 illustrates the span of an opening.
Figure 2:
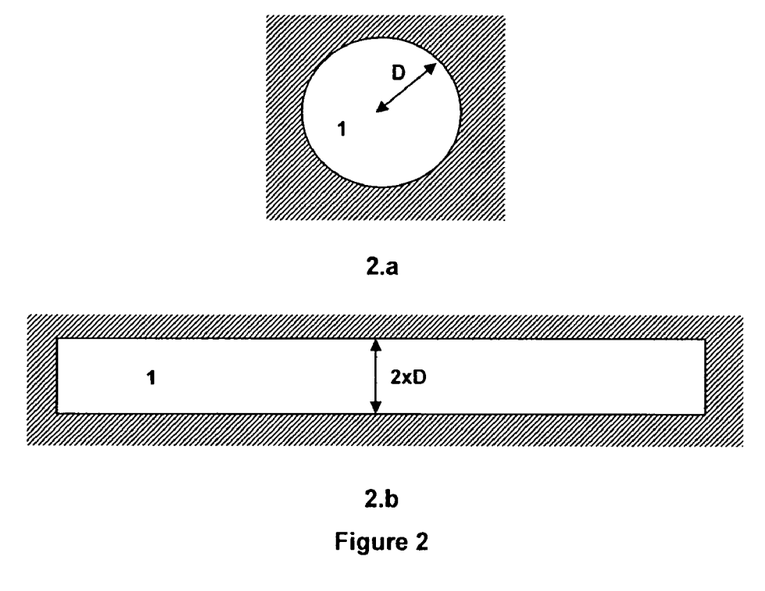

The openings or access holes in the membrane layer may be holes or trenches of different shapes. Through this description, an indicative measure for the dimensions of the openings or access holes may be given by a parameter called "span" (D). The span of an opening or access hole may be defined as the minimum value of a distance, measured orthogonally to the contour of the opening, for which shrinking the opening by moving the contour of the opening with a same distance (orthogonally to the contour of the opening) along the whole contour of the opening would cause the opening to be closed. This is illustrated in FIG. 1 and FIG. 2, wherein the span D of an opening is indicated. The areas 1 are uncovered parts of the opening, after a sealing or reflow layer is deposited on top of a film that comprises openings (see further). For example, for a circular opening, D corresponds to the radius of the opening, as illustrated in FIG. 2.a and for a rectangular opening, D corresponds to half of the width of the opening, as illustrated in FIG. 2.b.

With the method according to embodiments of the present invention openings or access holes with a span D approximately between 0.10 μm and 50 μm, between 0.25 μm and 40 μm, between 0.10 μm and 30 μm, between 0.10 μm and 20 μm or between 0.20 μm and 10 μm can be closed.

Figure 3A:
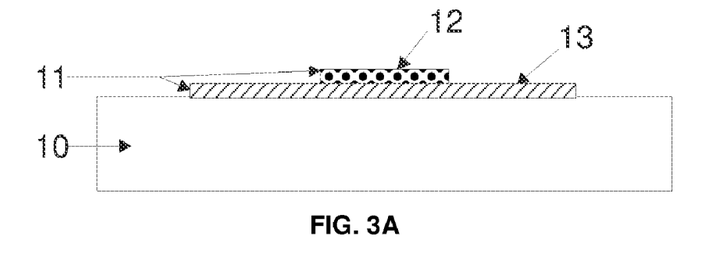
Figure 3B:
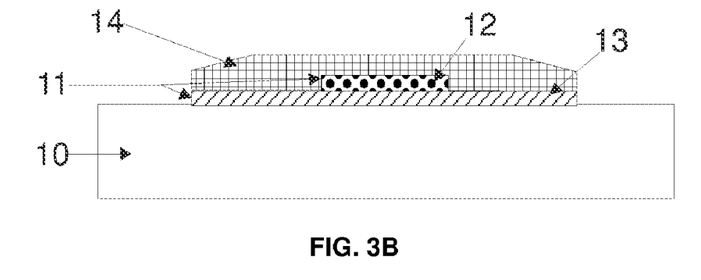
Figure 3C:
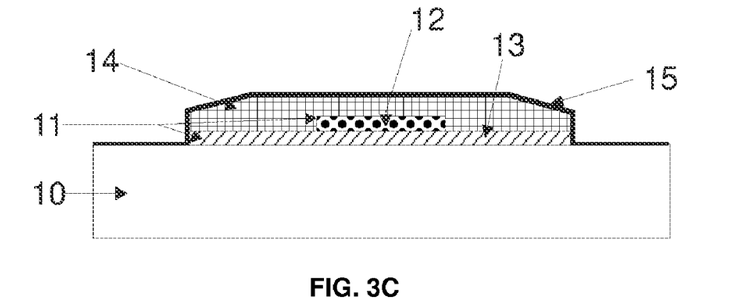
Figure 3D:
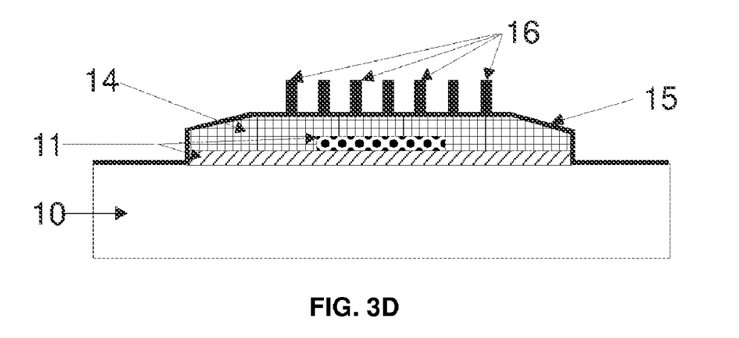

An example of a process flow according to embodiments of the invention will be described hereinafter. FIGS. 3.a to 3.h illustrate subsequent steps in a process flow according to embodiments of the present invention. It has to be understood that this is only for the ease of explanation and is not intended to limit the invention in any way. The method according to embodiments of the present invention may also comprise other steps or may use other materials. The method described hereinafter is for forming a sealed cavity. In one embodiment, the sealed cavity comprises a released fragile device, e.g. a MEMS or NEMS device.

The method as illustrated in FIG. 3.a to 3.h may start with providing a substrate 10. In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. doped silicon, a gallium arsenide (GaAs), a gallium arsenide phosphide (GaAsP), an indium phosphide (InP), a germanium (Ge), or a silicon germanium (SiGe) substrate. The "substrate" may include, for example, an insulating layer such as a $SiO_2$ or a $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the "substrate" may be any other base on which a layer is formed, for example a glass or metal layer. Preferred substrates that may be used in embodiments of the present invention are single crystal or polycrystalline Si, single crystal or polycrystalline Ge, glass, quartz or polymer.

In a next step, according to the present example, on the substrate 10 a structure 11 may be provided which may comprise a device 12, such as e.g. fragile MEMS or NEMS devices 12 with a support 13 (FIG. 3.a). In this stage of the method, the device 12 may be referred to as unreleased device as a support 13 is still present. Hereinafter, the method according to the present example will further be described with the device 12 being a MEMS or NEMS device 12. The unreleased MEMS or NEMS device 12 may be any MEMS or NEMS device, for example a MEMS or NEMS device requiring a vacuum or controlled atmosphere and pressure encapsulation. Examples of such devices are micro-accelerometers, micro-gyroscopes, micro-tubes, vibration micro-sensors, micro-mirrors, micro-mechanical resonators or resonant strain gauges, micro-mechanical filters, micro-switches, micro-electrical circuits, micro-relays, Integrated Circuits with air gaps, etc. The support 13 may be any suitable material known by a person skilled in the art. According to the method illustrated in FIG. 3.a to 3.h, in which the purpose is to form a sealed cavity comprising a released MEMS or NEMS device 12, the support 13 may be formed of a sacrificial material, such as e.g. a photoresist layer, a polymer layer, a germanium layer, an aluminum layer, a silicon oxide layer, a silicon layer, a SiGe layer, ..., because it will have to be removed for releasing the MEMS or NEMS device 12 (see further).

In the next step of the method according to embodiments of the present invention, a sacrificial layer 14, which may for example be a photoresist layer, a polymer layer, a germanium layer, an aluminum layer, a silicon oxide layer, a silicon layer, a SiGe layer, ..., is deposited and patterned, such that it at least covers the unreleased MEMS or NEMS device 12 (see FIG. 3.b). The thickness and width of the sacrificial layer 14 depends on the required size of the cavity to be formed (see further). The thickness of the sacrificial layer 14 may preferably be approximately between 1 µm and 10 µm. The sacrificial layer 14 may act as a sacrificial spacer for, in a later step of the method, forming a cavity in which the MEMS or NEMS device 12 will be hermetically encapsulated.

Subsequently, a seed layer 15 for plating may be formed on the sacrificial layer 14 (FIG. 3.c). The seed layer 15 may be formed by any suitable technique known by a person skilled in the art such as for example sputtering, electroplating or evaporation. The seed layer 15 may comprise an electrically conductive material, such as for example a metal (e.g. Cu, Au, Ni, Cr, Pb, Sn or Ag). After forming the seed layer 15, a non-conductive layer, such as for example a photoresist layer, a polymer layer or a silicon oxide layer, may be formed and patterned, hereby forming a plating mould for the membrane layer (see further). The non-conductive layer may be provided by any suitable method known by a person skilled in the art, such as for example by spinning the non-conductive material onto the seed layer 15, by depositing the non-conductive material onto the seed layer 15 by means of e.g. CVD techniques or by evaporating the non-conductive material onto the seed layer 15. Patterning of the non-conductive layer comprises forming at least one and preferably a plurality of pillars 16 (see FIG. 3.d), which will, in a later step of the method, serve to define openings or access holes to be formed in the membrane layer. The at least one pillar 16 extends, when the substrate 10 is lying in a plane, in a direction substantially perpendicular to the plane of the substrate 10. The at least one pillar 16 may have an aspect ratio of for example approximately 1:2, 1:3, 1:4, 1:5, 1:6 or 1:7. The width of the at least one pillar may then determine the width of the openings or access holes formed in the membrane layer (see further). The height of the at least one pillar 16 may be for example approximately between 0.5 µm and 50 µm. When a plurality of pillars 16 is formed, the distance between the pillars 16 may be approximately between 0 and 100 µm, more preferred between 0 and 50 µm and still more preferred between 0 and 10 µm.

A next step in the method according to embodiments of the present invention comprises providing a membrane layer 17 (FIG. 3.e). This may be done by any suitable technique known by a person skilled in the art, such as e.g. electroplating whereby a conductive material may be electroplated onto the seed layer 15 until an appropriate thickness is obtained (see further). The membrane layer 17 at least partially encompasses the at least one pillar 16 formed in the previous step along its length in a direction substantially perpendicular to the plane of the substrate 10. The thickness of the membrane layer 17 may be smaller, equal or higher than the height of the pillars 16 of the plating mould.

Figure 3E:
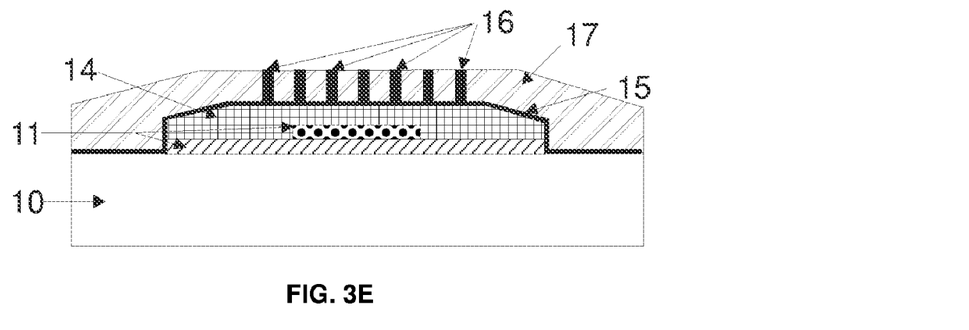
Figure 3F:
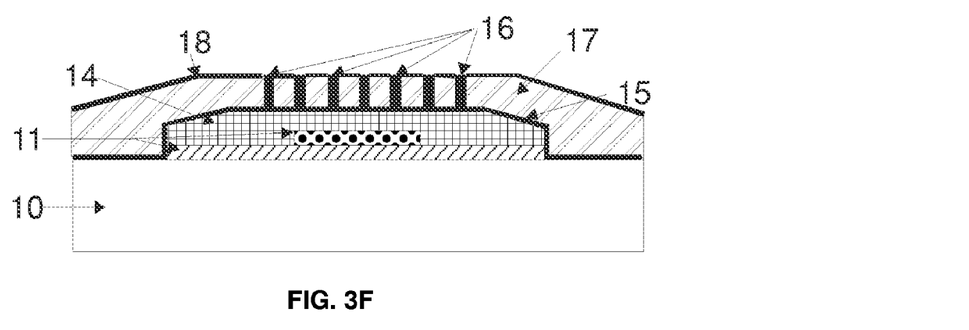

According to embodiments of the invention, where the thickness of the membrane layer 17 is equal to the height of the at least one pillar 16, first a membrane layer 17 may be deposited such that it covers the at least one pillar 16. In a next step, the excess of the membrane layer 17 above the at least one pillar 16 may be removed such that the thickness of the membrane layer 17 is equal to the height of the at least one pillar 16.

According to embodiments of the invention, where the thickness of the membrane layer 17 is higher than the height of the at least one pillar 16, first a membrane layer 17 may be deposited such that it covers the at least one pillar 16. In a next step, the membrane layer 17 may then patterned to form openings or holes at the location of the at least one pillar 16. According to other embodiments of the invention, wherein the thickness of the membrane layer 17 is higher than the height of the pillars 16, the process may be a so-called overplating process. This allows the formation of smaller openings or holes in the membrane layer 17 than in the former case, wherein the thickness of the membrane layer 17 is smaller than the height of the at least one pillar 16.

It has to be noted that, independent of the method it is formed with, the membrane layer 17 should be formed such that at least part of the at least one pillar 16 is not covered with the membrane layer 17 such that the at least one pillar 16 can be contacted with e.g. an etching solution for removing it in a later step in the method.

For the formation of the membrane layer 17, a high deposition speed may be preferred, such that a thick membrane layer 17 may be deposited in a limited time period. The thickness of the membrane layer 17 may be approximately between 0.5 µm and 50 µm, e.g. between 0.5 µm and 10 µm, between 0.5 µm and 20 µm or between 1 µm and 50 µm.

According to one embodiment of the present invention, the membrane layer 17 may be rigid, for example with a Young's modulus exceeding about 100 GPa, and strong, with a large yield strength, preferably between about 60 MPa and 80 MPa and with a large tensile strength, preferably between about 90 MPa and 120 MPa. Furthermore, the stress in the membrane layer 17 is a parameter to be taken into account for obtaining a stable membrane layer 17. Preferably, the membrane layer 17 may have a low tensile stress (preferably lower than about 100 MPa) at the end of the fabrication process. The two types of stress in thin films are thermal stress and intrinsic stress. Intrinsic stress may be generated during film formation and is strongly dependent on the process conditions. Thermal stress may be caused by the difference in thermal-mechanical properties between the membrane layer 17 and the underlying substrate onto which it is formed.

A common way to determine the stress ($\sigma$) in a film, in the example given the membrane layer 17, is by measuring the wafer curvature before and after deposition of the membrane layer 17 and using Stoney's equation [eq. 1]:

$$\sigma = \frac{1}{6} \frac{Y_s}{(1-\upsilon_S)} \frac{t_S^2}{t_f} \left( \frac{1}{R_{after}} - \frac{1}{R_{before}} \right) \quad [\text{Eq. 1}]$$

wherein $Y_s$ is the Young's modulus of the substrate, $\upsilon_s$ is Poisson's ratio for the substrate, $t_s$ the substrate thickness and $t_f$ the film thickness. $R_{before}$ and $R_{after}$ are the radii of curvature of the membrane layer 17 respectively before and after plating.

According to one embodiment of the present invention, a nickel membrane 17 having a high young's modulus of about 182 Gpa and electroplated from a Ni bath may be used to form the membrane layer 17. Additives such as for example Co, P or saccharin may be added to the Ni bath in order to obtain a stronger membrane layer 17.

In a next step, optionally a wetting layer may be formed on the membrane layer 17 (not shown in the figures). This wetting layer may reduce the surface tension of the sealing layer (see further) when reflowing it. The wetting layer may be formed by a selective deposition technique, for example by electrodeposition, or by sputtering or evaporation under an angle.

Next, a sealing layer 18 comprising a material with a low melting temperature (a melting temperature approximately below 200° C., preferably below 180° C., more preferred below 160° C.) is formed on the membrane layer 17, optionally with a wetting layer in between the membrane layer 17 and the sealing layer (FIG. 3.f). The sealing layer 18 may preferably be formed by means of a selective deposition technique, such as for example by electrodeposition or sputtering under an angle, such that the sealing layer 18 comprises openings or holes at the location of the at least one pillar 16. A requirement for the sealing layer 18 is that the openings or holes which will be formed in the membrane layer 17 are sealed after reflow of the sealing layer 18 in such a way that the MEMS or NEMS device 12 underneath is not damaged by deposition of material through the openings holes. The thickness of the sealing layer 18 must be large enough to be able to seal these holes in the membrane layer 17. Hence, the thickness of the sealing layer 18 may depend on the size of the openings or holes in the membrane layer 17. Any material that can be deposited and that can be reflowed at a temperature below the critical temperature of the complete structure or device, may be used as a sealing material, the critical temperature being the minimum temperature which, when applied to the structure or device, destroys it. Examples of such materials may be metals, such as In, Ti, Ta, W, Al, Cu, Cr, . . . and alloys or eutectic alloys thereof, semiconductor materials such as Ge, etc., solder materials such as SnPb, Bi, etc. In one embodiment of the present invention, the sealing layer may comprise In, which has a melting temperature of about 156.61° C., such that it allows a low thermal budget sealing process. In has also an excellent ductility, which allows joining materials of different thermal expansion coefficients.

In a next step, the at least one pillar 16 of the plating mould is removed, hereby forming vertical openings 19, also referred to as vertical access holes 19 (see FIG. 3.g). With vertical openings 19 is meant that, when the substrate 10 is lying in a plane, the openings 19 are formed through the membrane layer 17 in a direction substantially perpendicular to the plane of the substrate 10. This may preferably be done by an etching method, preferably a selective wet etching method such that only the material of the at least one pillar 16 is etched away but not the material of the membrane layer 17. Then the seed layer 15 may locally be removed, i.e. at the location of the holes or openings 19 in the membrane layer 17. This may, for example, be done by means of dry or wet etching.

Because, according to embodiments of the present invention, the at least one pillar 16 of the plating mould and the seed layer 15 are removed, and thus the holes or openings 19 in the membrane layer 17 are formed, after deposition of the optional wetting layer and the sealing layer 18, contrary to the method described in EP 1 433 741, any deposition of unwanted material onto the underlying MEMS or NEMS device 12 may be avoided.

Figure 3G:
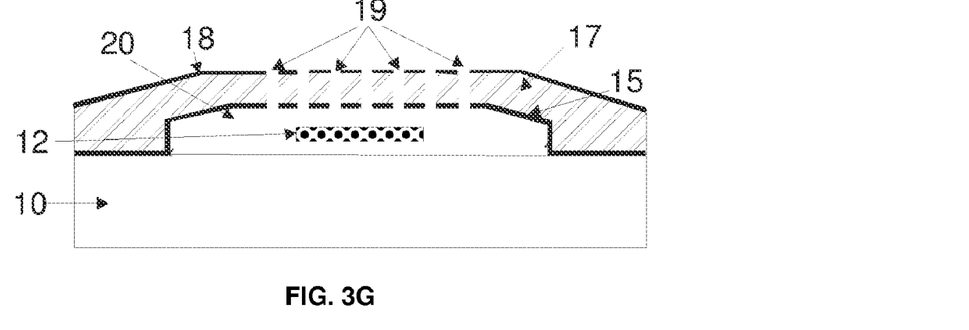
Figure 3H:
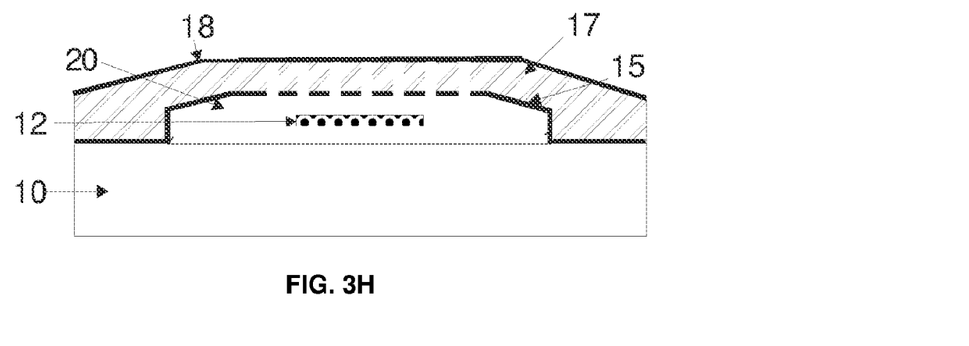

In a next step removal of at least part of the sacrificial layer 14 is performed through the vertical access holes 19 in the membrane layer 17. This is also referred to as sacrificial release. Sacrificial release may comprise etching away the sacrificial layer 14 so as to form a cavity 20. According to the present example, the sacrificial release may furthermore comprise removing the support 13 (see FIG. 3.g). In this way a released MEMS or NEMS device 12 is formed. After forming the cavity 20, the material of the membrane layer 17 forms a membrane, at least partially delimiting the cavity.

Figure 4:
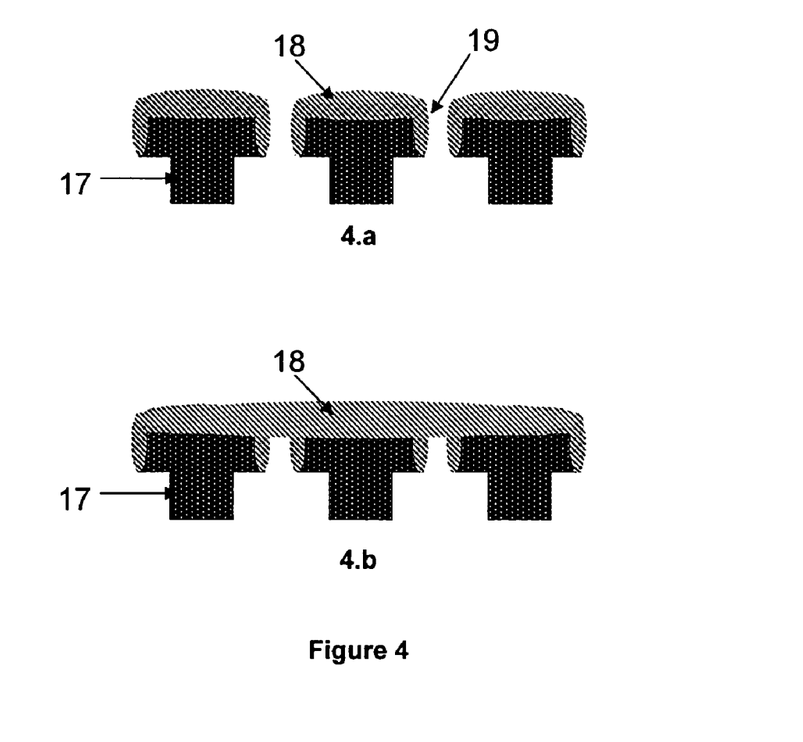

Then the sealing material of the sealing layer 18 is reflowed such that the vertical openings or access holes 19 in the membrane 17 are closed, which causes the underlying cavity 20 to obtain the atmosphere and pressure used during the reflow process (see FIG. 3.h). Reflowing or sealing may be done in a furnace in which the pressure and the atmosphere can be controlled. In this way the resulting atmosphere and pressure in the cavity 20 can be controlled. The reflow temperature should be higher than the melting point of the material of the sealing layer 18 and lower than the critical temperature of the whole device. The pressure may be substantially atmospheric pressure or it may be for example a pressure below atmospheric pressure, including vacuum. Reflow may be performed in an ambient with a gas, such as for example nitrogen or SF6. FIG. 4 schematically illustrates the sealing material 18 plated above the membrane layer 17 before reflow of the sealing layer 18 (FIG. 4a) and after reflow of the sealing layer 18 (FIG. 4b). The reflow process does not substantially cause any amount of material to enter the vertical openings or access holes 19. The sealing layer 18 may act as a functional layer of the device or of other devices.

Optionally, after reflow, a planarization step may be performed, so that after the reflow of the sealing layer a substantially flat surface may be obtained. This may be an advantage for further processing on top of the embedded device.

According to embodiments of the present invention, the vertical openings or access holes 19 in the membrane layer 17, which may be serving as etch holes during removal of the sacrificial layer 14 and optionally of the support 13 of the MEMS or NEMS device 12, are located in the membrane layer 17 above the MEMS or NEMS devices 12. As compared to prior art methods, wherein horizontal openings at the sides of the device are used (see U.S. Pat. No. 7,029,829), this may lead to reduced release times. According to embodiments of the present invention, release times may range from a few minutes to 30 minutes, depending on e.g. the number of access holes 19 and the distance between the access holes 19. The smaller the distance between the access holes 19 in the membrane layer 17, the lower the release time may be.

According to embodiments of the present invention, the rate of sacrificial layer removal by etching may be determined by the distance between the access holes 19, while in the case of a horizontal opening the rate of the sacrificial layer removal by etching is determined by the amount of sacrificial material to be removed. Hence, according to one embodiment, the rate of removal of the sacrificial layer 14 may be controlled by adjusting the distance between the access holes 19 in the membrane layer 17. For example, when a large cavity 20 is to be formed and thus a lot of sacrificial material has to be removed, more access holes 19 can be provided in the membrane layer 17 at a shorter distance in order to increase the removal rate of the sacrificial layer 14.

An optimization of the thickness of both the membrane layer 17 and the sealing layer 18 as well as an optimization of the size and shape of the vertical openings or access holes 19 may be required. The access holes 19 should be large enough to enable efficient sacrificial etching and small enough such that no or substantially no deposition of material inside the cavity takes place during sealing. As already described above, the span D of the access holes 19 may be approximately between 0.10 µm and 50 µm, between 0.25 µm and 40 µm, between 0.10 µm and 30 µm, between 0.10 µm and 20 µm or between 0.20 µm and 10 µm.

EXAMPLE

Experiments were performed wherein a nickel membrane 17 was electroplated from a conventional sulfamate plating bath (obtainable from Shipley Ronal). The pH of the solution was kept within a range of 3.8 to 4.5. The plating bath contained nickel sulfamate together with nickel chloride and boric acid. Boric acid buffers pH variations and nickel chloride was used to improve conductivity of the plating bath. The solution was held at a fixed temperature and was agitated during plating to improve the uniformity and consequently the conductivity in the bath. In different experiments, Nickel was plated with different thicknesses of 6 µm, 8 µm and 10 µm at current densities (J) ranging from 1 to 4 A/dm² and at temperatures of 50° C., 55° C. and 60° C.

Figure 5:
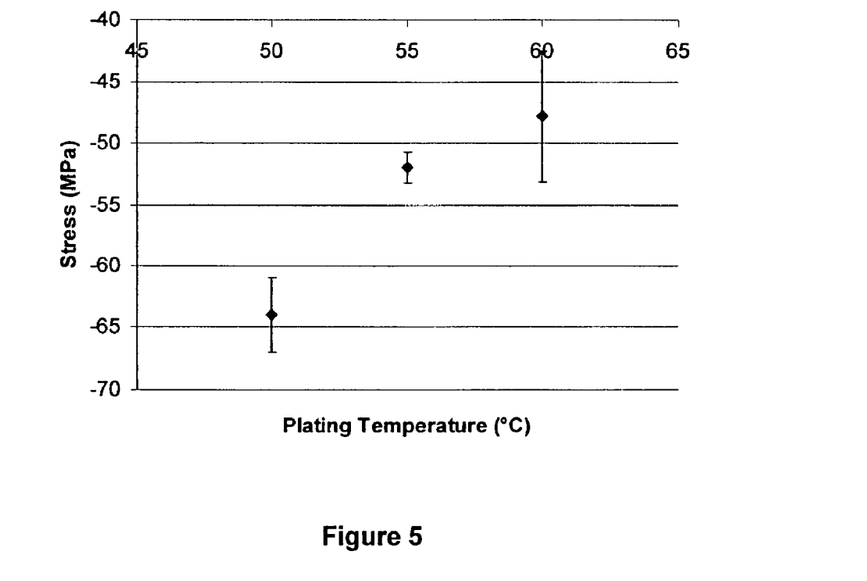
FIG. 5 shows the stress as measured for a 6 µm thick electroplated Ni layers as a function of the plating temperature.

The substrates used in the experiments to optimize the stress in the nickel membrane were 6" silicon wafers with a conducting seed layer on top. This conducting seed layer was made by sputtering a 30 nm Ti thick adhesion layer and a 150 nm thick Cu seed layer onto the silicon wafer. After sputtering the seed layer, wafer bow was measured with a MX203 stress meter. The nickel film was then electroplated with a current density of J=1.41 A/dm². Different samples were processed, with nickel film thicknesses of 6 µm, 8 µm and 10 µm. The wafer bow was then measured again for each of the samples and the stress was calculated using Stoney's equation (see [Eq. 1]). FIG. 5 shows the measured stress for 6 µm thick nickel layers plated at a constant current density at different temperatures, i.e. at temperatures of 50° C., 55° C. and 60° C. The stress values obtained were between −48 MPA and −63 MPa. The negative values correspond to compressive stress. The same experiments were performed for Nickel layers of 8 µm and 10 µm. From these experiments it was found that stresses are not dependent on the layer thickness.

The effect of the reflow process on the internal stress of the plated nickel layers was studied by annealing nickel samples in a furnace under a controlled atmosphere at 180° C. for different time periods. The stress in the nickel layer was found to change from low compressive stress to low tensile stress after a reflow process. Table 1 shows results for Ni layers electroplated with J=1.41 A/dm² and T=55° C. and whereby annealing was performed at 180° C. for 5 minutes. Negative values for the stress indicate a compressive stress and positive values indicate a tensile stress. A low tensile stress is obtained after annealing, as is preferred for the membrane layer 17.

TABLE 1 stress values for Nickel layers with different thickness before and after annealing.

| Thickness as plated (µm) | Average Stress (MPa) | Average Stress after annealing (MPa) |
|---|---|---|
| 6 µm | −50.3 ± 1.5 | 91 ± 2 |
| 8 µm | −52.8 ± 0.3 | 81 ± 1 |
| 10 µm | −45 ± 2 | 85 ± 3 |

Furthermore, tests on nickel over-plating were done. The process started with 6" silicon wafers on which a titanium/copper seed layer was deposited. To simulate the packaging process, pillars 16 were then formed on the silicon wafers by photolithography. The photoresist pillars were defined by 6 µm thick and 1 to 15 µm wide lines and equally wide spaces. Then, nickel was electroplated on these wafers comprising photoresist pillars, up to a thickness, which is larger than the resist thickness, hereby providing a nickel layer comprising holes with a different, smaller width than the width of the pillars that were defined on the substrate. Different nickel thicknesses of 8 µm, 9 µm and 11 µm were plated. With this over-plating process, small etch or access holes 19 can be created in the membrane 17 without the need for expensive lithography tools. For example, after electroplating an 11 µm thick nickel layer, features smaller than 10 µm are closed whereas features having larger sizes are reduced considerably.

Sealing experiments were performed, wherein electroplated indium was selected as a sealing material. On the test wafers used, patterned nickel layers were present, with patterns formed of 1 to 15 µm wide lines and equally wide spaces. On these test wafers, films of different thickness, i.e. of 1.5 µm, 2 µm, 2.5 µm and 3 µm, of indium were deposited by electroplating with a current density of 0.5 to 5 A/dm² until the trenches were nearly closed. In this context, nearly closed means that etchants can still penetrate through the holes and that release of the sacrificial layer 14 to form the cavity 20 still can be accomplished. The indium anode used for this purpose had a purity exceeding 99.998%. In a method according to one embodiment, reflowing the indium layer is done after mould resist or pillar removal, seed layer etch and sacrificial release (see earlier). On the test wafers, which are used to characterize and optimize the sealing process, no sacrificial layers were present. Therefore only the mould resist or pillar was removed before reflowing the indium. This reflow was performed in a Rapid Thermal Process (RTP) furnace in a N₂ atmosphere at atmospheric pressure and at temperatures above the melting temperature of the material, in the example given at 180° C. Openings with a width of 15 µm and a height of 6 µm on the test wafers were sealed. No deposited material was observed at the bottom of the trenches.

Figure 6:
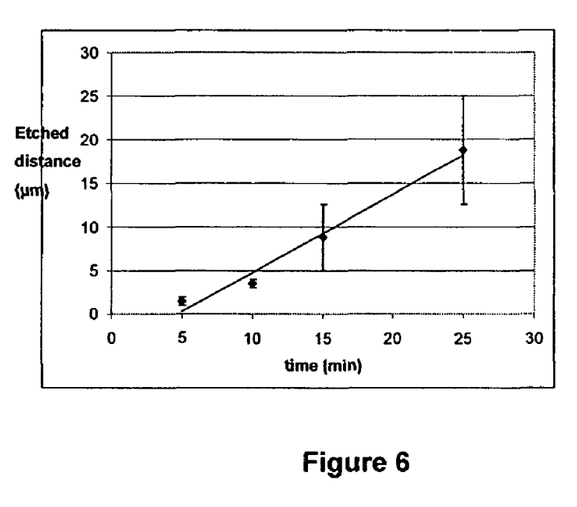
FIG. 6 shows sacrificial etch rate as measured by evaluating the width of released cantilevers.

According to the real process in accordance to embodiments of the present invention, after providing, e.g. plating, the sealing layer 18, the mould resist or pillar 16 is removed and the seed layer 15 is at least locally etched away. Then the sacrificial layer 14 below the membrane layer 17 is to be removed at least partly to form the cavity 20. This can be done by using an oxygen plasma. Etch test structures such as cantilevers were used to determine the etch rate of photo-resist sacrificial layers 14 in an oxygen plasma. The samples had a 6 µm thick Ni layer 17, forming cantilever structures, and a 3 µm thick photo-resist sacrificial layer 14. The cantilevers had a width of 2, 4, 6, 8, 10 and 25 µm. The samples were placed in a chamber with a downstream oxygen plasma at a pressure of 1600 mTorr and a chuck temperature of 25° C. The sacrificial etch rate was measured on test structures by evaluating the width of the released cantilevers after etching for 5 minutes, 10 minutes, 15 minutes and 25 minutes. Results are shown in FIG. 6, wherein the etched distance (under-etching under the cantilever structures) is shown as a function of the etching time. From these results, the etch rate in the example given was found to be about 0.9 µm/min (see FIG. 6). Under-etching of the cantilever structures was almost linear as a function of the etching time. From the measured etch rate, the release time for a given design can be estimated. For example, if the distance in between access holes 19 is 8 µm, a release time of less then 15 minutes may be expected, while if the distance is 25 µm, the expected release time is about 30 minutes.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A method of forming a sealed cavity, the method comprising:
   providing a sacrificial layer onto a substrate lying in a plane;
   providing a seed layer on the sacrificial layer, the seed layer being formed from an electrically conductive material;
   providing on the seed layer at least one structure extending in a direction substantially perpendicular to the plane of the substrate, the structure being formed from a non-conductive material;
   after providing the at least one structure, providing a membrane layer such that the at least one structure is at least partially encompassed by the membrane layer along its height;
   after providing the at least one structure and the membrane layer, providing a sealing layer on the membrane layer, the sealing layer covering the membrane layer and having one or more openings at the location of the at least one structure;
   after providing the membrane layer and the sealing layer, removing the at least one structure, hereby forming at least one hole through the membrane layer in a direction substantially perpendicular to the plane of the substrate;
   removing at least part of the sacrificial layer through the at least one hole, hereby forming a cavity; and
   sealing the at least one hole in the membrane layer.

2. The method according to claim 1, wherein providing at least one structure comprises:
   providing a layer; and
   patterning the layer so as to form at least one pillar.

3. The method according to claim 1, wherein providing a membrane layer is performed by electroplating a conductive material.

4. The method according to claim 1, wherein providing the sealing layer is performed by electroplating sealing layer material.

5. The method according to claim 1, wherein sealing the at least one hole in the membrane layer comprises reflowing the sealing layer such that the at least one hole is closed.

6. The method according to claim 1, wherein sealing the at least one hole in the membrane layer is performed at a predetermined atmosphere and at a predetermined pressure.

7. The method according to claim 1, wherein the pressure in the cavity after sealing is substantially atmospheric pressure or a pressure lower than atmospheric pressure.

8. The method according to claim 1, wherein the method is performed at temperatures not exceeding a critical temperature of materials used in the layers.

9. The method according to claim 1, wherein providing the membrane layer is performed such that the thickness of the membrane layer is larger than the thickness of the at least one structure.

10. The method according to claim 1, wherein the tensile stress in the membrane layer as provided is lower than about 100 MPa.

11. The method according to claim 8, wherein the critical temperature of the materials used in the layers is lower than about 200° C.

12. The method according to claim 1, wherein the sacrificial layer comprises a photoresist layer.

13. The method according to claim 1, the method further comprising providing a wetting layer after providing the membrane layer and before providing the sealing layer.

14. The method according to claim 1, wherein removing at least part of the sacrificial layer is performed within less than about 30 minutes.

15. The method according to claim 1, wherein the sealing layer comprises a conductive layer with a melting temperature lower than about 200° C.

16. The method according to claim 15, wherein the conductive layer comprises a metal layer.

17. The method according to claim 1, wherein a span of the at least one hole is approximately between 0.10 μm and 50 μm.

18. The method according to claim 1, wherein the cavity comprises a fragile device, a MEMS device or a NEMS device.

19. The method according to claim 18, the method further comprising releasing the MEMS device or NEMS device after removing at least part of the sacrificial layer.

20. A method of forming a sealed cavity, the method comprising:
   (a) providing at least one structure on a sacrificial layer, the sacrificial layer lying in a plane, the at least one structure extending in a direction substantially perpendicular to the plane of the substrate;
   (b) providing a membrane layer such that the at least one structure is at least partially encompassed by the membrane layer along its height;
   (c) providing a sealing layer on the membrane layer, the sealing layer covering the membrane layer and having one or more openings at the location of the at least one structure;
   (d) removing the at least one structure, thereby forming at least one hole through the membrane layer in a direction substantially perpendicular to the plane of the substrate;
   (e) removing at least part of the sacrificial layer through the at least one hole, hereby forming a cavity; and
   (f) sealing the at least one hole in the membrane layer,
   wherein the method is performed in sequence from (a) to (f), wherein the process of providing the at least one structure comprises:
   providing a seed layer on the sacrificial layer, the seed layer being formed from an electrically conductive material, and
   providing on the seed layer at least one structure extending in a direction substantially perpendicular to the plane of the substrate, the structure being formed from a non-conductive material.

* * * * *